（12）United States Patent
Daimon

(10) Patent No.: US 11,271,545 B2
(45) Date of Patent: Mar. 8, 2022

(54) MULTIPLEXER, RADIO-FREQUENCY FRONT END CIRCUIT, AND COMMUNICATION DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 162 days.

(21) Appl. No.: 16/831,874

(22) Filed: Mar. 27, 2020

(65) Prior Publication Data

US 2020/0228098 A1 Jul. 16, 2020

Related U.S. Application Data

(63) Continuation of application No. PCT/JP2018/036005, filed on Sep. 27, 2018.

(30) Foreign Application Priority Data

Sep. 29, 2017 (JP) .............................. JP2017-192162

(51) Int. Cl.
*H03H 9/64* (2006.01)
*H03H 9/72* (2006.01)
(Continued)

(52) U.S. Cl.
CPC ...... *H03H 9/6483* (2013.01); *H03H 9/02015* (2013.01); *H03H 9/02228* (2013.01);
(Continued)

(58) Field of Classification Search
CPC .......... H03H 9/64; H03H 9/6483; H03H 9/72; H03H 9/725; H03H 9/25
See application file for complete search history.

(56) References Cited

U.S. PATENT DOCUMENTS 5,909,156 A * 6/1999 Nishihara .......... H03H 9/02929
333/193
6,271,617 B1 * 8/2001 Yoneda ................ H03H 9/6483
310/313 D
(Continued)

FOREIGN PATENT DOCUMENTS

JP 2007-074754 A 3/2007
WO 2009/147787 A1 12/2009
(Continued)

OTHER PUBLICATIONS

Official Communication issued in International Patent Application No. PCT/JP2018/036005, dated Nov. 20, 2018.

*Primary Examiner* — Dean O Takaoka
(74) *Attorney, Agent, or Firm* — Keating & Bennett, LLP

(57) ABSTRACT

A first filter of a multiplexer has a ladder filter structure including a plurality of series resonators and a plurality of parallel resonators. Each resonator is an acoustic wave resonator that includes an IDT electrode including a pair of comb-shaped electrodes. A portion having a unit area, in a plan view of a substrate on which the resonators are provided, has a larger weight in at least one of the IDT electrode of the series resonator that is closest to the common terminal, among the series resonator, and the IDT electrode of the parallel resonator that is closest to the common terminal than in the IDT electrode of each of the remainder of the plurality of acoustic wave resonators.

18 Claims, 7 Drawing Sheets

(51) Int. Cl.
*H03H 9/25* (2006.01)
*H03H 9/02* (2006.01)
*H04B 1/04* (2006.01)

(52) U.S. Cl.
CPC .......... *H03H 9/02275* (2013.01); *H03H 9/25* (2013.01); *H04B 1/0458* (2013.01)

(56) References Cited

U.S. PATENT DOCUMENTS

| | | | | |
|---|---|---|---|---|
| 7,109,828 | B2* | 9/2006 | Takayama | H03H 9/6483 |
| | | | | 333/193 |
| 7,692,515 | B2* | 4/2010 | Hauser | H03H 9/6423 |
| | | | | 333/133 |
| 7,948,333 | B2* | 5/2011 | Ruile | H03H 3/02 |
| | | | | 333/193 |
| 9,923,539 | B2* | 3/2018 | Matsuda | H03H 3/08 |
| 2004/0174233 | A1 | 9/2004 | Takayama et al. | |
| 2011/0095845 | A1 | 4/2011 | Fujiwara et al. | |
| 2013/0285768 | A1 | 10/2013 | Watanabe et al. | |
| 2018/0123565 | A1 | 5/2018 | Takamine | |
| 2018/0254763 | A1 | 9/2018 | Yamamoto et al. | |

FOREIGN PATENT DOCUMENTS

| | | | |
|---|---|---|---|
| WO | 2012/086639 | A1 | 6/2012 |
| WO | 2016/208677 | A1 | 12/2016 |
| WO | 2017/038679 | A1 | 3/2017 |

* cited by examiner

MULTIPLEXER, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2017-192162 filed on Sep. 29, 2017 and is a Continuation Application of PCT Application No. PCT/JP2018/036005 filed on Sep. 27, 2018. The entire contents of each application are hereby incorporated herein by reference.

BACKGROUND OF THE INVENTION

1. Field of the Invention

The present invention relates to a multiplexer that includes filters including acoustic wave resonators and relates to a radio-frequency front end circuit and a communication device.

2. Description of the Related Art

In recent years, multiplexers that separate (split) a radio-frequency signal into multiple frequency bands have been widely used in communication devices such as mobile phone terminals in order to allow a plurality of frequency bands and a plurality of wireless methods, i.e., multiple bands and multiple modes to be handled using a single terminal. A filter used in such a multiplexer is formed using acoustic wave resonators, for example.

As an example of an acoustic wave resonator, an acoustic wave device that is formed by stacking a high-acoustic-velocity film, a low-acoustic-velocity film, a piezoelectric film, and an IDT electrode in this order on a support substrate has been proposed (see, for example, refer to International Publication No. 2012/086639). The acoustic wave device has high efficiency at confining acoustic wave energy in the thickness direction of a multilayer substrate, can handle higher frequencies, and can realize a high Q value, and is therefore suitable to provide a filter that is small in size and has small transmission loss.

In a filter using acoustic wave resonators, it is known that a response is generated at an upper end of the stop band (region in which the wavelength of acoustic waves is constant due to the acoustic waves being confined by a grating) outside the pass band of the filter. In particular, a comparatively large stop band response is likely to be generated in a filter that uses acoustic wave resonators having a high acoustic wave energy confinement efficiency such as the acoustic wave resonator having the multilayer structure disclosed in International Publication No. 2012/086639.

Although this stop band response is not problematic in terms of the characteristics within the pass band of the filter itself, in a multiplexer in which paths that pass through a plurality of filters are connected together, the stop band response may affect the characteristics of another filter and cause degradation of the characteristics of the other filter. Specifically, when the frequency at which the stop band response is generated is located inside the pass band of the other filter, the stop band response causes an increase in a ripple inside the pass band of the other filter (pass band ripple).

SUMMARY OF THE INVENTION

Preferred embodiments of the present invention provide multiplexers that are each able to significantly reduce or prevent a response at an upper end of a stop band of a filter and to provide radio-frequency front end circuits and a communication devices.

A preferred embodiment of the present invention provides a multiplexer that includes a common terminal; a first terminal; and a second terminal; a first filter that is provided on a first path electrically connected between the common terminal and the first terminal and that includes a plurality of acoustic wave resonators; and a second filter that is provided on a second path electrically connected between the common terminal and the second terminal and that has a pass band located at a higher frequency than that of the first filter. The plurality of acoustic wave resonators includes two or more series resonators provided on the first path, and one or more parallel resonators provided on paths electrically connected between nodes on the first path and ground. A first series resonator that is closest to the common terminal among the two or more series resonators is electrically connected to the common terminal without any of the parallel resonators located therebetween. The plurality of acoustic wave resonators each include a substrate that exhibits piezoelectricity and an IDT electrode including a pair of comb-shaped electrodes provided on the substrate. A portion having a unit area, in a plan view of the substrate, has a larger weight in the IDT electrode of at least one out of the first series resonator and a first parallel resonator that is closest to the common terminal among the one or more parallel resonators than in the IDT electrode of each of the remainder of the plurality of acoustic wave resonators.

A preferred embodiment of the present invention provides a multiplexer that includes a common terminal; a first terminal; and a second terminal; a first filter that is provided on a first path electrically connected between the common terminal and the first terminal and that includes a plurality of acoustic wave resonators; and a second filter that is provided on a second path electrically connected between the common terminal and the second terminal and that has a pass band located at a higher frequency than that of the first filter. The plurality of acoustic wave resonators includes one or more series resonators provided on the first path, and two or more parallel resonators provided on paths electrically connected between the first path and ground. The two or more parallel resonators include a first parallel resonator that is located on a side where the common terminal is provided and a parallel resonator that is located on a side where the first terminal is provided as seen from a first series resonator that is closest to the common terminal among the one or more series resonators. The plurality of acoustic wave resonators each include a substrate that exhibits piezoelectricity and an IDT electrode including a pair of comb-shaped electrodes provided on the substrate. A portion having a unit area, in a plan view of the substrate, has a larger weight in the IDT electrode of at least one out of the first parallel resonator and the first series resonator than in the IDT electrode of each of the remainder of the plurality of acoustic wave resonators.

Here, the weight of a portion of an IDT electrode having a unit area in a plan view of the substrate (for simplicity, also called the weight per unit area) is an integral value of the product of electrode film thickness and electrode material density in an arbitrary cross section in a direction perpendicular or substantially perpendicular to the substrate of the IDT electrode taken over that portion of the IDT electrode.

In other words, the weight per unit area of the IDT electrode increases as the electrode film thickness of the portion having the unit area increases and as the electrode material density of the portion having the unit area increases.

Thus, the stop band response of at least one of the first series resonator and the first parallel resonator, which greatly affect the second filter, is able to be significantly reduced or prevented by setting the weight per unit area of the IDT electrode of at least one out of the first series resonator and the first parallel resonator to be larger than the weight per unit area of the IDT electrode of each of the remaining acoustic wave resonators. Thus, a response generated in the stop band of the first filter is able to be significantly reduced or prevented and the insertion loss in the pass band of the second filter is able to be reduced.

According to the multiplexers and so forth of preferred embodiments of the present invention, a response generated in a stop band of a filter is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Background to Present Invention

Figure 1:
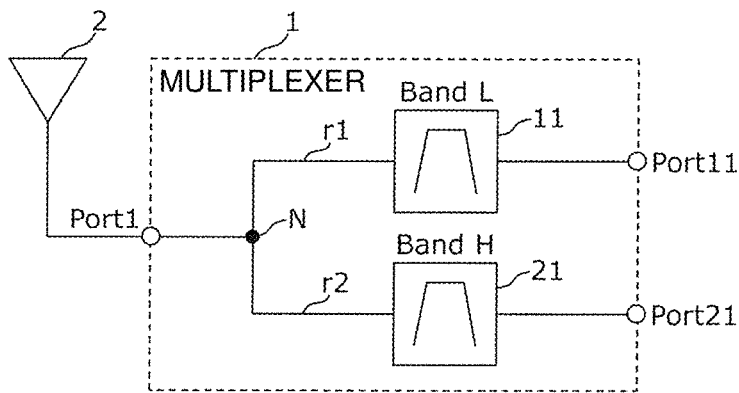
FIG. 1 is a basic diagram of a multiplexer that is included in both a preferred embodiment of the present invention and a comparative example.

First, common features of preferred embodiments of the present invention will be described while referring to FIGS. 1 to 4. FIG. 1 is a basic diagram of a multiplexer 1 that is included in both a preferred embodiment of the present invention and a comparative example. In the diagram, an antenna element 2 that is connected to a common terminal Port 1 is also shown.

The multiplexer 1 includes the common terminal Port 1, a first terminal Port 11, a second terminal Port 21, a first filter 11, and a second filter 21. The first filter 11 is arranged on a first path r1 connected between the common terminal Port 1 and the first terminal Port 11. The second terminal Port 21 is arranged on a second path r2 connected between the common terminal Port 1 and the second terminal Port 21. The frequency pass band of the second filter 21 is higher than that of the first filter 11.

Figure 2:
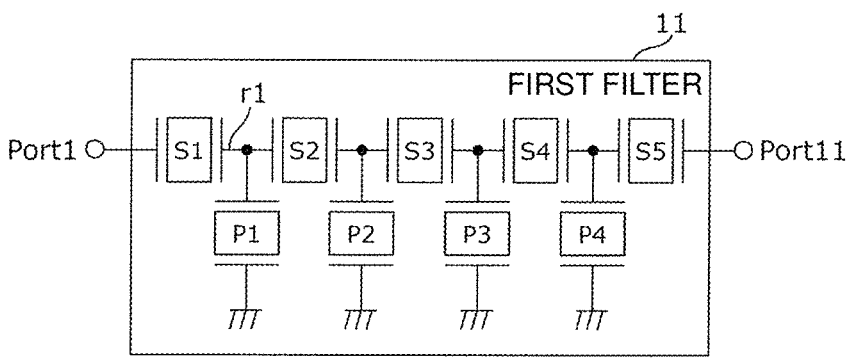
FIG. 2 is a circuit diagram showing a first filter of a multiplexer according to a comparative example.

FIG. 2 is a circuit diagram showing a first filter 11 of a multiplexer 1 according to a comparative example.

The first filter 11 according to the comparative example is a ladder filter that includes a plurality of acoustic wave resonators. The first filter 11 includes series resonators S1, S2, S3, S4, and S5, which are acoustic wave resonators arranged on the first path r1, and parallel resonators P1, P2, P3, and P4, which are acoustic wave resonators arranged on paths connected between the first path r1 and ground. The series resonators S1 to S5 are arranged in this order from the common terminal Port 1 to the first terminal Port 11. The parallel resonator P1 is connected between the series resonators S1 and S2, the parallel resonator P2 is connected between the series resonators S2 and S3, the parallel resonator P3 is connected between the series resonators S3 and S4, and the parallel resonator P4 is connected between the series resonators S4 and S5. Hereafter, all or some of the series resonators S1 to S5 and the parallel resonators P1 to P4 may be referred to as "resonators".

Figure 3:
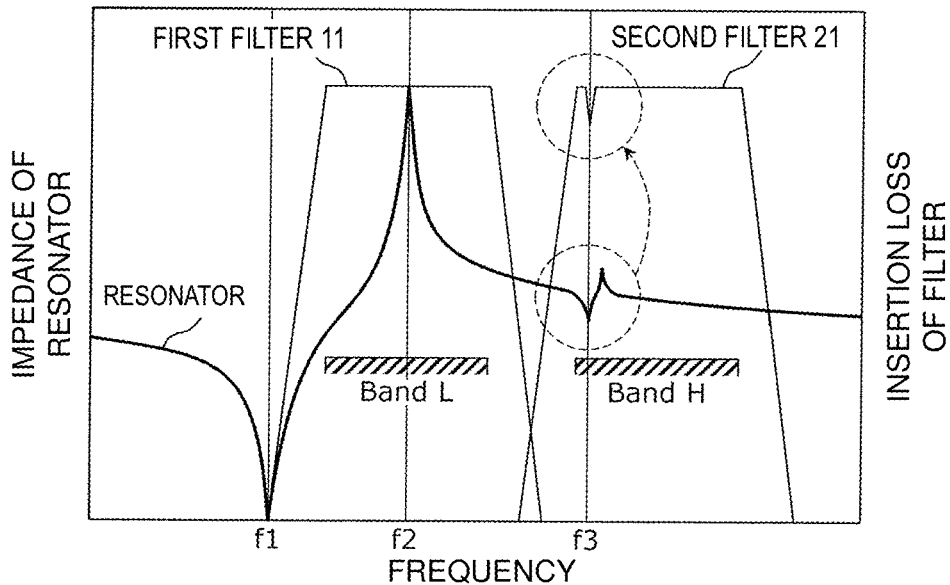
FIG. 3 is a diagram showing a response generated in a stop band of the first filter according to the comparative example.

A problem that may occur in the multiplexer 1 according to the comparative example will be described while referring to FIG. 3. FIG. 3 is a diagram showing a response generated in a stop band of the first filter 11 according to the comparative example. The thick line in the graph in FIG. 3 represents the impedance characteristic of the series resonator S1, which has a resonant frequency f1 and an anti-resonant frequency f2, and the thin line in the graph in FIG. 3 represents the insertion loss of the first filter 11 and the insertion loss of the second filter 21.

The stop band response is a spurious component generated by the reflectors of the resonator and, for example, appears as a ripple-shaped disturbance in the impedance at a frequency higher than the anti-resonant point of the resonator. As shown in FIG. 3, when a stop band response caused by any resonator of the first filter 11 is generated at a frequency f3 inside the pass band of the second filter 21, a portion of the signal at the frequency f3 that should have been reflected by the first filter 11 is lost without being reflected and a ripple is generated in the pass band of the second filter 21. The stop band response generated by a resonator of the first filter 11 is significantly reduced or prevented in order to reduce the ripple in the second filter 21.

As described above, in a filter that includes acoustic wave resonators, a stop band response is generated outside the pass band of the filter. In particular, although a filter that is small in size and has a small transmission loss can be provided when using an acoustic wave resonator that has a high acoustic wave energy confinement efficiency, it is likely that a comparatively large stop band response will be generated. Accordingly, a technique is needed to significantly reduce or prevent the stop band response.

Next, description will be provided regarding which resonators among the plurality of resonators included in the first filter 11 have stop band responses that have the greatest effects on the second filter 21, i.e., description will be provided regarding which resonators should have their stop band responses significantly reduced or prevented in order to effectively reduce the insertion loss of the second filter 21.

Figure 4:
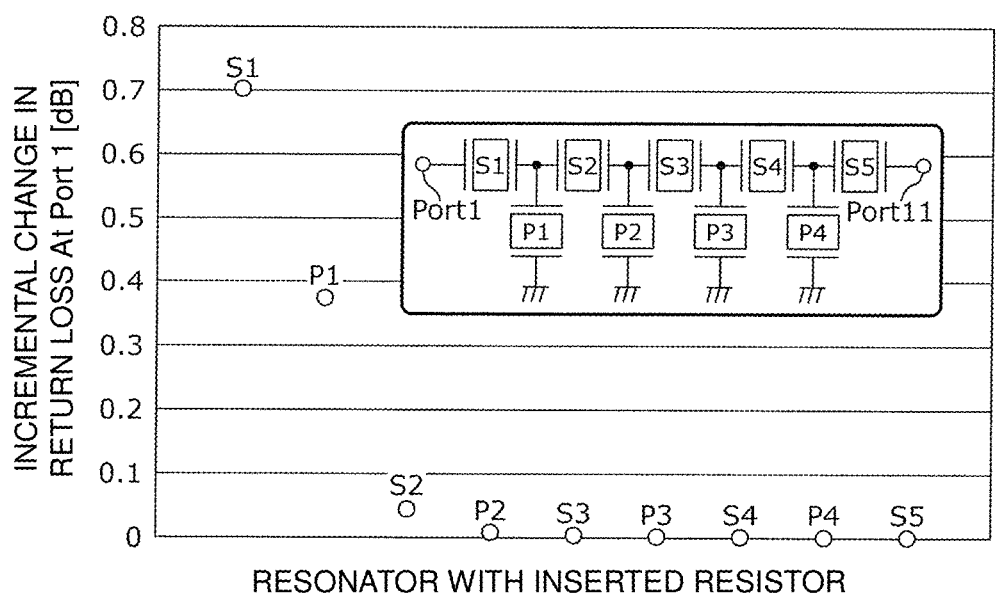
FIG. 4 is a diagram showing return loss of the first filter of the comparative example.

FIG. 4 is a diagram showing the return loss of the first filter 11 of the comparative example. FIG. 4 is a diagram showing the incremental changes in return loss that occur when a resistance is inserted into one of the plurality of resonators of the first filter 11 and a signal of a prescribed frequency is input compared with the return loss in a case where the signal of the prescribed frequency is input to the first filter 11 from the common terminal Port 1. The signal of a prescribed frequency that is input to the first filter 11 is a signal that lies inside the stop band of the first filter 11 and includes a frequency in the pass band of the second filter 21.

Insertion of a resistance into a resonator simulates a state where a stop band response is generated in that resonator. The return loss of the first filter 11 increases by differing degrees depending on the resonator into which the resistance is inserted, i.e., depending on the resonator in which the stop band response is generated.

Here, "return loss" refers to the reflection loss of the first filter 11 as seen from the common terminal Port 1, and reflection of the signal from the first filter 11 becomes smaller as return loss increases. That is, a signal having a frequency in the pass band of the second filter 21 is absorbed by the first filter 11 and therefore insertion loss in the second filter 21 is increased.

As shown in FIG. 4, the incremental change in return loss that occurs when the resistance is inserted into the series resonator S1, which is closest to the common terminal Port 1, is about 0.7 dB at maximum and the incremental change in return loss that occurs when the resistance is inserted into the parallel resonator P1, which is second closest to the common terminal Port 1, is about 0.38 dB at maximum. On the other hand, the incremental change in return loss that occurs when the resistance is inserted into the series resonator S2, which is third closest to the common terminal Port 1, is about 0.05 dB at maximum and the incremental changes in return loss that occur when the resistor is inserted into the resonators P2 to P4 and S3 to S5, which are fourth closest and so on to the common terminal Port 1 are around 0 dB and the return loss in these cases can be regarded as having almost not increased at all.

Thus, the increase in return loss in the first filter 11 is largest when the stop band response is generated in resonators located close to the common terminal Port 1, more specifically, the series resonator and the parallel resonator in the first stage next to the common terminal Port 1. Therefore, an effective countermeasure to reduce the insertion loss of the second filter 21 is to significantly reduce or prevent the stop band responses in the series resonator and the parallel resonator in the first stage next to the common terminal Port 1.

In the multiplexer 1 of this preferred embodiment, the resonators that are located near the common terminal Port 1 have a structure that significantly reduces or prevents the stop band response. As a result, the insertion loss in the pass band of the second filter 21 can be reduced.

Hereafter, preferred embodiments of the present invention will be described in detail with respect to examples and the drawings. The preferred embodiments described hereafter each show a comprehensive or specific example of the present invention. The numerical values, shapes, materials, elements, arrangements of the elements, the ways in which the elements are connected, and so forth described in the following preferred embodiments are merely examples and are not intended to limit the present invention. Furthermore, in the drawings, parts of configurations that are substantially the same as each other are denoted by the same symbols and repeated description thereof may be omitted or simplified. In addition, in the following preferred embodiments, "is connected" is not limited to meaning directly connected and also includes the case of being electrically connected via another element or the like.

Preferred Embodiment 1

A multiplexer 1 according to preferred embodiment 1 of the present invention will be described while referring to FIGS. 1 and 5 to 9. Although there is some overlap between constituent elements included in preferred embodiment 1 and the above-described comparative example, such overlapping constituent elements will be described again in preferred embodiment 1.

1-1. Configuration of Multiplexer

The multiplexer 1 of preferred embodiment 1 is a multiplexer (splitter) that includes a plurality of filters that have different pass bands from each other and the antenna-side terminals of the plurality of filters are connected together at the common terminal Port 1. Specifically, as shown in FIG. 1, the multiplexer 1 includes a common terminal Port 1, a first terminal Port 11, a second terminal Port 21, a first filter 11, and a second filter 21.

The common terminal Port 1 is commonly provided for both the first filter 11 and the second filter 21 and is connected to the first filter 11 and the second filter 21 inside the multiplexer 1. Furthermore, the common terminal Port 1 is connected to an antenna element 2 outside the multiplexer 1. That is, the common terminal Port 1 is an antenna terminal of the multiplexer 1.

The first terminal Port 11 is connected to the first filter 11 inside the multiplexer 1. The second terminal Port 21 is connected to the second filter 21 inside the multiplexer 1. In addition, the first terminal Port 11 and the second terminal Port 21 are connected to a radio-frequency integrated circuit (RFIC) (not shown) via an amplification circuit and so forth (not shown) outside the multiplexer 1.

The first filter 11 is arranged on a first path r1 connected between the common terminal Port 1 and the first terminal Port 11. The first filter 11 is preferably, for example, a reception filter that uses a downlink frequency band (reception band) in a low band (Band L) as a pass band.

The second filter 21 is arranged on a second path r2 connected between the common terminal Port 1 and the second terminal Port 21. The second filter 21 is preferably, for example, a reception filter that uses a downlink frequency band (reception band) in a high band (Band H) as a pass band.

The first filter 11 and the second filter 21 have characteristics so that the reception band of the corresponding Band (or reception band) is allowed to pass therethrough and the other bands are attenuated. In preferred embodiment 1, the frequency of the pass band of the second filter 21 is higher than that of the first filter 11.

The first path r1 and the second path r2 are connected to each other at a node N. That is, the node N is the point at which the first path r1 and the second path r2 are connected to each other. In the multiplexer 1, an impedance element, for example, an inductor for impedance matching may be connected along the first path r1 connected between the first filter 11 and the node N and along the second path r2 connected between the second filter 21 and the node N, or along the path connected between the node N and the common terminal Port 1, and so on.

1-2. Configuration of Filter

Next, the features of the first filter 11 and the second filter 21 will be described with respect to the first filter 11 having Band L as a pass band as an example.

Figure 5:
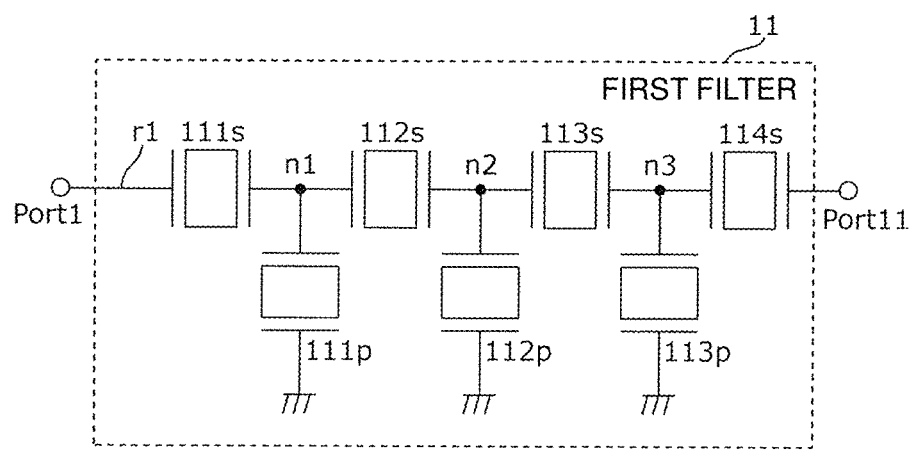
FIG. 5 is a circuit diagram showing a first filter of a multiplexer according to preferred embodiment 1 of the present invention.

FIG. 5 is a circuit diagram depicting the first filter 11. As shown in FIG. 5, the first filter 11 includes series resonators 111s, 112s, 113s, and 114s and parallel resonators 111p, 112p, and 113p, which are acoustic wave resonators. Hereafter, all or some of the series resonators 111s to 114s and the parallel resonators 111p to 113p may be referred to as "resonators 110".

The series resonators 111s to 114s are connected in series with each other in this order from the side near the common terminal Port 1 on the first path (series arm) r1 connected between the common terminal Port 1 and the first terminal Port 11. Furthermore, the parallel resonator 111p to 113p are connected in parallel with each other on paths (parallel arms) connected between nodes n1, n2, and n3, which are located between the adjacent series resonators 111s to 114s on the first path r1, and reference terminals (ground). Specifically, the series resonator 111s, which is closest to the common terminal Port 1, is connected to the common terminal Port 1 without any of the parallel resonators 111p to 113p located therebetween. First ends of the parallel resonators 111p to 113p are each connected to one of the nodes n1, n2, and n3 and second ends thereof are connected to the reference terminals.

Thus, the first filter 11 preferably has, for example, a T-type ladder filter structure including two or more series resonators arranged on the first path r1 (four series resonators in preferred embodiment 1) and one or more parallel resonators arranged on paths connected between the first path r1 and reference terminals (three parallel resonators in preferred embodiment 1).

The numbers of series resonators and parallel resonators of the first filter 11 are not limited to being respectively four and three, and it is sufficient that there be two or more series resonators and one or more parallel resonators. In addition, the parallel resonators may be connected to the reference terminals via inductors. In addition, an impedance element, for example, an inductor and a capacitor may be inserted along or connected to the series arm or the parallel arms. Furthermore, although the reference terminals to which the parallel resonators are connected are provided in an individual manner in FIG. 5, whether or not the reference terminals are provided in an individual manner or a shared manner can be appropriately selected in accordance with, for example, constraints on the mounting layout of the first filter 11 and so on.

1-3. Structure of Acoustic Wave Resonator

Next, the basic structure of the resonators 110 of the first filter 11 will be described. The resonators 110 of preferred embodiment 1 are preferably surface acoustic wave (SAW) resonators, for example.

The second filter 21, which is the other filter, is not limited to the above structure and may be configured as appropriate in accordance with the predetermined filter characteristics and so forth. Specifically, the second filter 21 does not need to have a ladder filter structure and, for example, may instead have a longitudinally-coupled filter structure. Furthermore, the resonators defining the second filter 21 are not limited to being SAW resonators and, for example, may instead be bulk acoustic wave (BAW) resonators. In addition, the second filter 21 may be formed without resonators and, for example, may instead be an LC resonance filter or a dielectric filter.

Figure 6:
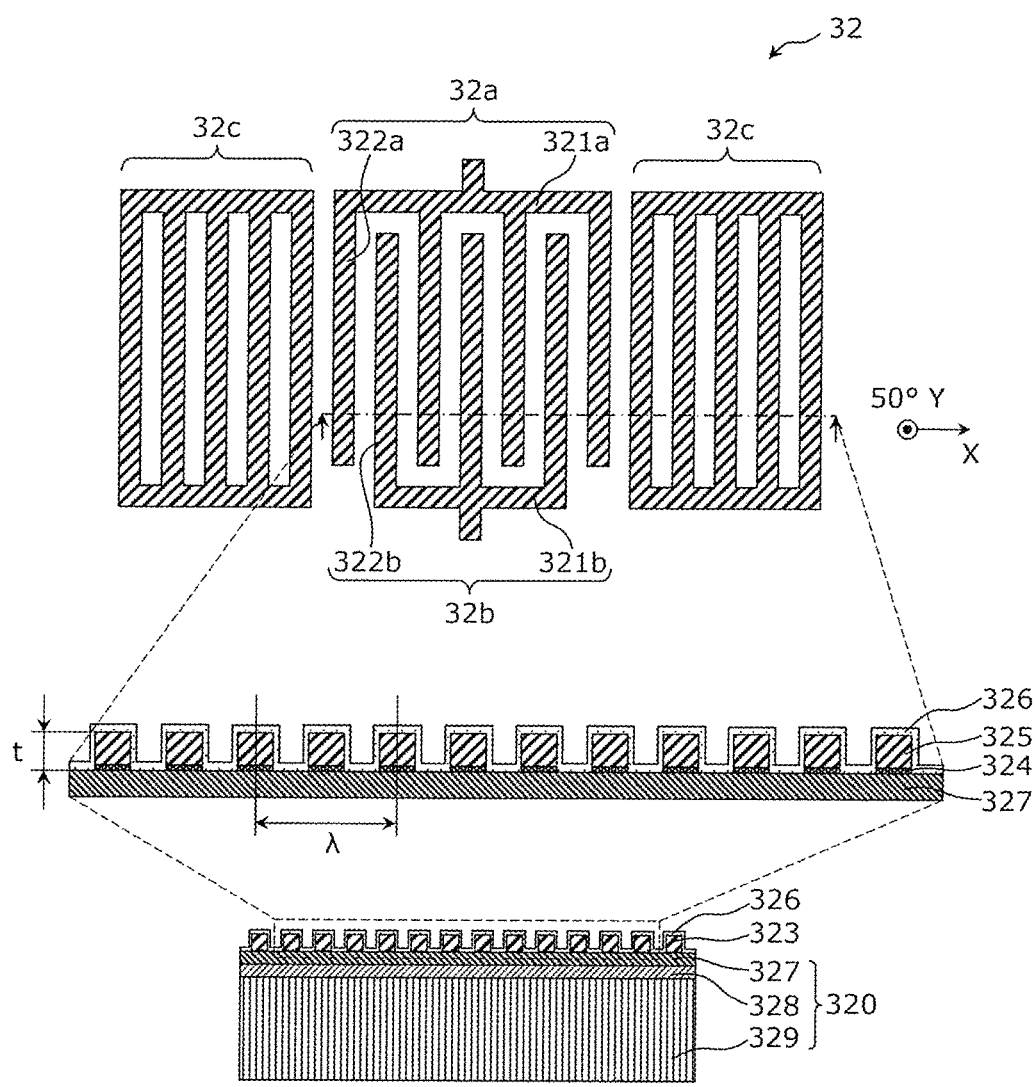
FIG. 6 depicts a plan view and a sectional view that show an acoustic wave resonator of the first filter according to preferred embodiment 1 of the present invention.

FIG. 6 depicts a plan view and a sectional view that show the resonator 110 of the first filter 11. The resonator 110 is shown in FIG. 6 to indicate the typical structure of the resonators 110, and the number, length, and so forth of the electrode fingers forming the electrodes are not limited to those shown in this example.

As shown in the plan view in FIG. 6, the resonator 110 includes a pair of comb-shaped electrodes 32a and 32b that face each other and reflectors 32c that are arranged in an acoustic wave propagation direction X with respect to the pair of comb-shaped electrodes 32a and 32b. The pair of comb-shaped electrodes 32a and 32b form an IDT electrode 32.

The comb-shaped electrode 32a includes a plurality of electrode fingers 322a that are arranged like the teeth of a comb and are parallel or substantially parallel to each other and a busbar electrode 321a that connects the ends of the plurality of electrode fingers 322a to each other. In addition, the comb-shaped electrode 32b includes a plurality of electrode fingers 322b that are arranged like the teeth of a comb and are parallel or substantially parallel to each other and a busbar electrode 321b that connects the ends of the plurality of electrode fingers 322b to each other. The plurality of electrode fingers 322a and 322b extend in a direction perpendicular or substantially perpendicular to the acoustic wave propagation direction X.

A pair of reflectors 32c are arranged in the acoustic wave propagation direction X with respect to the pair of comb-shaped electrodes 32a and 32b. Specifically, the pair of comb-shaped electrodes 32a and 32b is located between the pair of reflectors 32c in the acoustic wave propagation direction X. Each reflector 32c includes a plurality of reflection electrode fingers that are parallel or substantially parallel to each other and reflector busbar electrodes that connect the plurality of reflection electrode fingers to each other. The pair of reflectors 32c are configured so that the reflector busbar electrodes extend along the acoustic wave propagation direction X.

1-4. Cross-sectional Structure of Acoustic Wave Resonator

Next, the cross-sectional structure of the resonator 110 will be described while again referring to FIG. 6.

As shown in the sectional view of FIG. 6, the IDT electrode 32, which includes the plurality of electrode fingers 322a and 322b and the busbar electrodes 321a and 321b, has a multilayer structure including an adhesive layer 324 and a main electrode layer 325. In addition, the cross-sectional structure of the reflectors 32c is the same or substantially the same as that of the IDT electrode 32, and therefore description thereof will be omitted below.

The adhesive layer 324 improves the adhesion between a piezoelectric layer 327 and the main electrode layer 325, and, for example, Ti is preferably used as the material thereof. The film thickness of the adhesive layer 324 is preferably about 12 nm, for example.

For example, Al including about 1% Cu is preferably used as the material of the main electrode layer 325. The film thickness of the main electrode layer 325 is preferably about 162 nm, for example.

A protective layer 326 covers the IDT electrode 32. The purpose of the protective layer 326 is to protect the main electrode layer 325 from the outside environment, adjust the frequency-temperature characteristic, increase moisture resistance, and so forth, and, for example, is preferably a film having silicon dioxide as a main component. The film thickness of the protective layer 326 is preferably about 25 nm, for example.

A thickness t of the IDT electrode 32 may be defined as the thickness of the portion of the IDT electrode 32 made of a conductive material. That is, the thickness of the IDT electrode 32 may be taken to be the sum of the thickness of the adhesive layer 324 and the thickness of the main electrode layer 325 of the adhesive layer 324, the main electrode layer 325, and the protective layer 326. In this case, according to the above example dimensions, for example, the thickness t of the IDT electrode 32 is preferably about 174 nm, which is the sum of a film thickness of about 12 nm of the adhesive layer 324 and a film thickness of about 162 nm of the main electrode layer 325.

Since the adhesive layer 324 is usually much thinner than the main electrode layer 325, the thickness t of the IDT electrode 32 may be defined as the thickness of the main electrode layer 325. In this case, according to the above example dimensions, the thickness t of the IDT electrode 32 is preferably, for example, the film thickness of about 162 nm of the main electrode layer 325.

The IDT electrode 32 and the reflectors 32c are arranged on a main surface of a substrate 320, which will be described next. Hereafter, the multilayer structure of the substrate 320 in preferred embodiment 1 will be described.

As shown in the lower portion of FIG. 6, the substrate 320 has a structure that includes a high-acoustic-velocity support substrate 329, a low-acoustic-velocity film 328, and the piezoelectric layer 327 and in which the high-acoustic-velocity support substrate 329, the low-acoustic-velocity film 328, and the piezoelectric layer 327 are stacked on top of one another in this order.

The piezoelectric layer 327 is a piezoelectric film that includes the IDT electrode 32 and the reflectors 32c arranged on a main surface thereof. For example, the piezoelectric layer 327 is preferably made of a 50° Y cut X propagation LiTaO₃ piezoelectric single crystal or a piezoelectric ceramic (lithium tantalate single crystal cut along plane having a normal line that is an axis rotated 50° from a Y axis around an X axis or a ceramic, surface acoustic waves propagating in the X axis direction in the single crystal or ceramic) The thickness of the piezoelectric layer 327 is preferably, for example, less than or equal to about 3.5λ where λ is the wavelength of an acoustic wave determined by the electrode pitch of the IDT electrode 32, and is, for example, about 600 nm.

The high-acoustic-velocity support substrate 329 supports the low-acoustic-velocity film 328, the piezoelectric layer 327, and the IDT electrode 32. The high-acoustic-velocity support substrate 329 is a substrate in which the acoustic velocity of a bulk wave inside the high-acoustic-velocity support substrate 329 is higher than that of a surface acoustic wave or a boundary acoustic wave propagating along the piezoelectric layer 327 and the high-acoustic-velocity support substrate 329 confines a surface acoustic wave to the portion of the substrate where the piezoelectric layer 327 and the low-acoustic-velocity film 328 are stacked and does not leak into the region below the high-acoustic-velocity support substrate 329. The high-acoustic-velocity support substrate 329 is preferably, for example, a silicon substrate and has a thickness of about 125 μm, for example.

The low-acoustic-velocity film 328 is a film in which the acoustic velocity of a bulk wave inside the low-acoustic-velocity film 328 is lower than the acoustic velocity of a bulk wave propagating along the piezoelectric layer 327, and is arranged between the piezoelectric layer 327 and the high-acoustic-velocity support substrate 329. Leaking of surface acoustic wave energy to outside the IDT electrode 32 is significantly reduced or prevented by this structure and by the property that the energy of an acoustic wave is naturally concentrated in a low-acoustic-velocity medium. The low-acoustic-velocity film 328 is preferably, for example, a film having silicon dioxide as a main component. The thickness of the low-acoustic-velocity film 328 is preferably, for example, less than or equal to about 2λ where λ is the wavelength of an acoustic wave determined by the electrode pitch of the IDT electrode 32, and is, for example, about 670 nm.

According to the above-described multilayer structure of the substrate 320 in preferred embodiment 1, the Q values at the resonant frequency and the anti-resonant frequency can be greatly increased compared with, for example, a structure of the related art in which a piezoelectric substrate is included as a single layer. However, according to the multilayer structure, the acoustic wave energy confinement efficiency in the thickness direction of the substrate 320 is high, and therefore the stop band response generated by the resonator 110 is unlikely to be attenuated and will remain. Therefore, in the resonator 110 of preferred embodiment 1 having the above-described multilayer structure, a countermeasure to reduce or prevent the stop band response is preferred.

Accordingly, in preferred embodiment 1, the weight per unit area of the IDT electrode of at least one out of the series resonator 111s that is closest to the common terminal Port 1 and the parallel resonator 111p that is closest to the common terminal Port 1 is set to be larger than the weight per unit area of the IDT electrode of each of the resonators 112s to 114s, 112p, and 113p, which are the remaining resonators.

The weight per unit area of the IDT electrode refers to the weight of a portion of the IDT electrode having a unit area in a plan view of the substrate, and may be specifically defined as the product of the average electrode film thickness and the average electrode material density in that portion of the IDT electrode. More precisely, the weight per unit area of the IDT electrode may be defined as an integral value of the product of the electrode film thickness and the electrode material density in an arbitrary cross section in a direction perpendicular to the substrate of the IDT electrode taken over that portion of the IDT electrode. According to these definitions, in the case where the electrode material of the IDT electrode is the same or substantially the same, a large weight per unit area of the IDT electrode and a large electrode film thickness of the IDT electrode are synonymous.

1-5. Advantageous Effects Etc.

Figure 7:
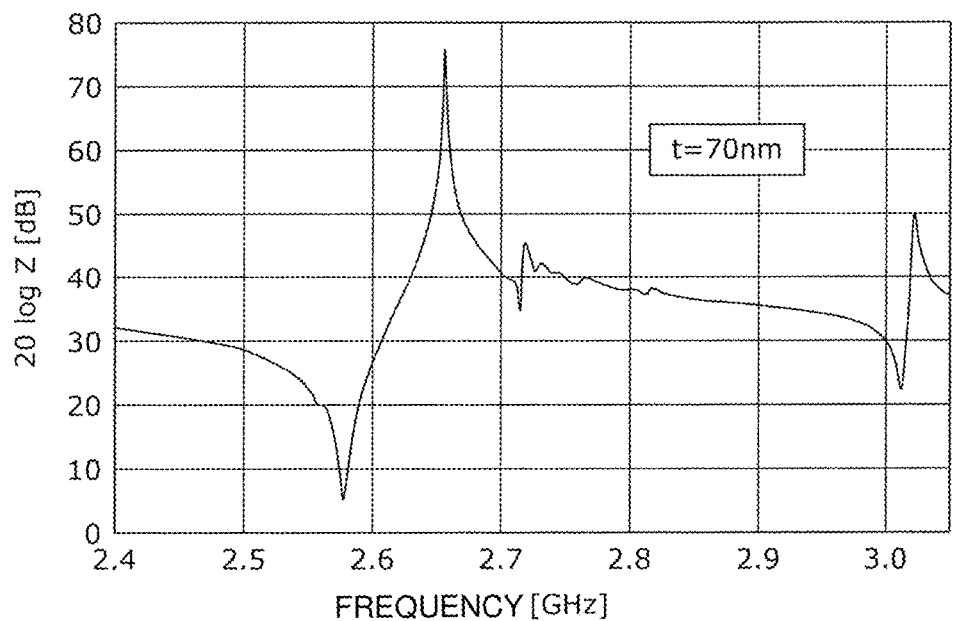
FIG. 7 is a diagram showing the impedance of an acoustic wave resonator having a thin IDT electrode.
Figure 8:
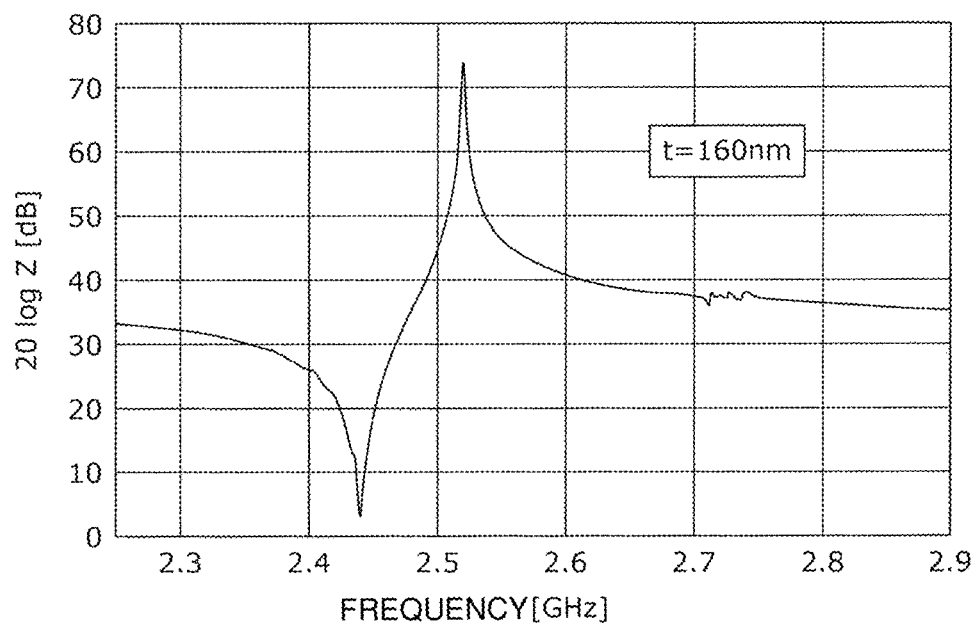
FIG. 8 is a diagram showing the impedance of an acoustic wave resonator having a thick IDT electrode.

FIGS. 7 and 8 are diagrams showing the impedances of resonators 110 resulting from different thicknesses t of IDT electrodes 32 made of the same or substantially the same material. Specifically, FIGS. 7 and 8 are diagrams showing the relationship between frequency and impedance for a case where the electrode materials of the IDT electrodes 32 of the resonators 110 are the same or substantially the same and the respective thicknesses t of the IDT electrodes 32 are about 70 nm and about 160 nm.

As shown in FIGS. 7 and 8, in the resonator 110 in which the thickness t of the IDT electrode 32 is about 70 nm, the disturbance in the impedance in the stop band of the first filter 11 is comparatively large, and a clear stop band response appears at a frequency of around 2700 MHz, which is in the pass band of the second filter 21.

In contrast, in the resonator 110 in which the thickness t of the IDT electrode 32 is about 160 nm, the disturbance in the impedance in the stop band of the first filter 11 is small and the stop band response negligibly appears in the pass band of the second filter 21.

Therefore, it is clear that the stop band response can be reduced by including a resonator 110 having a thick IDT electrode 32, i.e., a large weight per unit area compared with the case of a resonator 110 having a thinner IDT electrode 32. Therefore, the stop band response of the first filter 11 can be reduced and the insertion loss of the second filter 21 can be effectively reduced by setting the weight per unit area of the IDT electrode of at least one out of the series resonator 111s and the parallel resonator 111p to be larger than the weight per unit area of the IDT electrode of each of the series resonators 112s to 114s, 112p, and 113p, which are the remaining resonators.

The multiplexer 1 according to preferred embodiment 1 includes the common terminal Port 1, the first terminal Port 11, and the second terminal Port 21, the first filter 11 arranged on the first path r1 connected between the common terminal Port 1 and the first terminal Port 11, and the second filter 21 arranged on the second path r2 connected between the common terminal Port 1 and the second terminal Port 21 and having a pass band located at a higher frequency than that of the first filter 11.

The first filter 11 includes two or more series resonators arranged on the first path r1 (for example, the series resonators 111s to 114s) and one or more parallel resonators arranged on paths connected between the nodes n1 to n3, which are located between the adjacent series resonators 111s to 114s on the first path r1, and ground (for example, the parallel resonators 111p to 113p). The series resonator 111s, which is closest to the common terminal Port 1 among the two or more series resonators 111s to 114s, is connected to the common terminal Port 1 without any of the parallel resonators 111p to 113p located therebetween.

Each resonator among the two or more series resonators 111s to 114s and the one or more parallel resonators 111p to 113p includes the IDT electrode 32 including the pair of comb-shaped electrodes 32a and 32b provided on the substrate 320 exhibiting piezoelectricity and the reflectors 32c.

The weight per unit area of the IDT electrode 32 of at least one of the series resonator 111s and the parallel resonator 111p is larger than the weight per unit area of the IDT electrode 32 of each of the resonators 112s to 114s, 112p, and 113p. Here, the series resonator 111s is an example of a first series resonator, the parallel resonator 111p is an example of a first parallel resonator, and the resonators 112s to 114s and 112p and 113p are examples of the remaining resonators.

By setting the weight per unit area of the IDT electrode 32 of at least one of the series resonator 111s, which is closest to the common terminal Port 1, and the parallel resonator 111p, which is closest to the common terminal Port 1, to be larger than the weight per unit area of the IDT electrode 32 of each of the remaining resonators 112s to 114s, 112p, and 113p in this way, generation of the stop band response of at least one out of the series resonator 111s and the parallel resonator 111p, which greatly affect the second filter 21, is able to be significantly reduced or prevented. Thus, the stop band response of the first filter 11 is able to be significantly reduced or prevented and insertion loss in the pass band of the second filter 21 is able to be effectively reduced.

In a resonator 110 in which the weight per unit area of the IDT electrode 32 is large, variations in the resonant frequency and the anti-resonant frequency with changes in temperature, i.e., the temperature coefficients of the resonant frequency and the anti-resonant frequency are larger than in a resonator 110 in which the weight per unit area of the IDT electrode 32 is small. This will be explained by using the insertion loss of filters including acoustic wave resonators including IDT electrodes provided of the same or substantially the same electrode material but having different thicknesses as an example.

Figure 9:
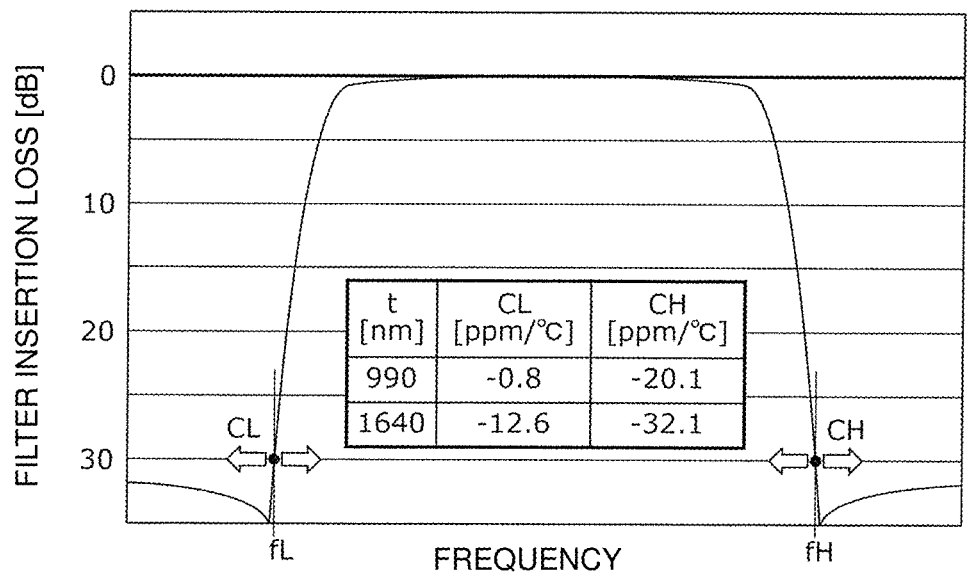
FIG. 9 is a diagram showing the temperature stability of the pass band of a filter.

FIG. 9 is a diagram showing the temperature stability of the pass bands of filters including acoustic wave resonators including IDT electrodes made of the same or substantially the same electrode material but having different thicknesses t.

In the example in FIG. 9, in a bandpass filter including acoustic wave resonators in which the thickness t of the IDT electrodes is about 990 nm, temperature coefficients CL and CH of frequencies fL and fH at which the insertion loss is about 30 dB on both sides of the pass band are about −0.8 ppm/° C. and about −20.1 ppm/° C., respectively. In contrast, temperature coefficients CL and CH in a band pass filter having the same or substantially the same circuitry but including acoustic wave resonators in which the thickness t of the IDT electrodes is about 1640 nm are about −12.6 ppm/° C. and about −32.1 ppm/° C., respectively.

In other words, a filter including resonators 110 in which the IDT electrodes 32 are thick, i.e., in which the weight per unit area of the IDT electrodes 32 is large is disadvantageous in terms of the temperature stability of the pass band compared with a filter including resonators 110 in which the IDT electrodes 32 are thin, i.e., in which the weight per unit area of the IDT electrodes 32 is small.

Therefore, in the first filter 11, the attenuation characteristic at both ends of the pass band may be defined not by at least one out of the series resonator 111s and the parallel resonator 111p but rather by the resonators 112s to 114s and 112p and 113p in which the weight per unit area of the IDT electrodes is small compared with the series resonator 111s and the parallel resonator 111p. An adverse effect on the temperature stability of the first filter 11 caused by the series resonator 111s and the parallel resonator 111p can be eliminated in this way and therefore a first filter 11 can be obtained that is excellent in terms of both the stop band response and the temperature stability of the pass band.

Modification 1 of Preferred Embodiment 1

In a multiplexer 1 according to modification 1 of preferred embodiment 1, the weights per unit area of the IDT electrodes of both the series resonator 111s and the parallel resonator 111p are set larger than the weight per unit area of the IDT electrode of each of the resonators 112s to 114s, 112p, and 113p.

Figure 10:
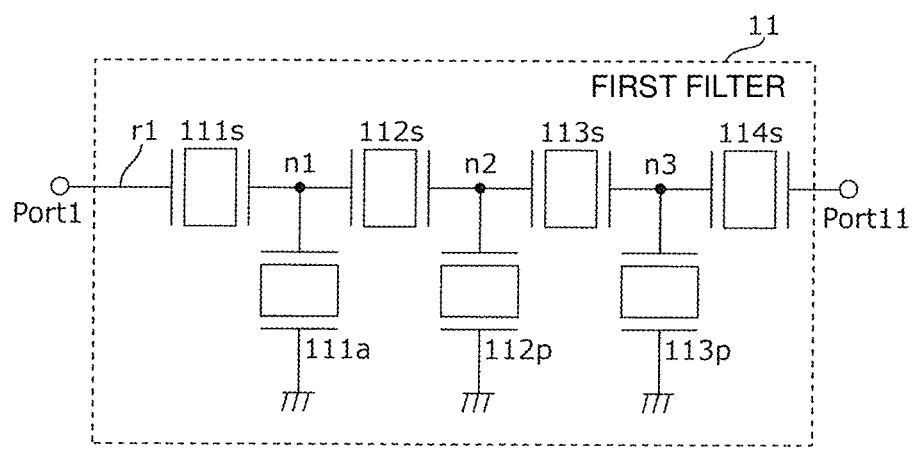
FIG. 10 is a circuit diagram of a first filter according to modification 1 of preferred embodiment 1 of the present invention.

FIG. 10 is a circuit diagram of a first filter 11 according to modification 1 of preferred embodiment 1. The first filter 11 according to modification 1 includes a parallel resonator 111a instead of the parallel resonator 111p shown in preferred embodiment 1. The parallel resonator 111a is an example of a first parallel resonator that is arranged at a position closest to the common terminal Port 1 among the plurality of parallel resonators 111a, 112p, and 113p.

In the first filter 11 of modification 1, the weights per unit area of the IDT electrodes of both the series resonator 111s and the parallel resonator 111a are larger than the weight per unit area of the IDT electrode of each of the remaining resonators 112s to 114s, 112p, and 113p. The weight per unit area of the IDT electrode of the series resonator 111s and the weight per unit area of the IDT electrode of the parallel resonator 111a may be the same as each other or may be different from each other.

A response in the stop band of the first filter 11 is able to be further reduced or prevented by including the above-described features for both the series resonator 111s and the parallel resonator 111a, which affect the second filter 21, among the series resonators 111s to 114s and the parallel resonators 111a, 112p, and 113p of the first filter 11.

Modification 2 of Preferred Embodiment 1

In a multiplexer 1 according to modification 2 of preferred embodiment 1, the series resonator 111s of the first filter 11 is defined by divided resonators.

Figure 11:
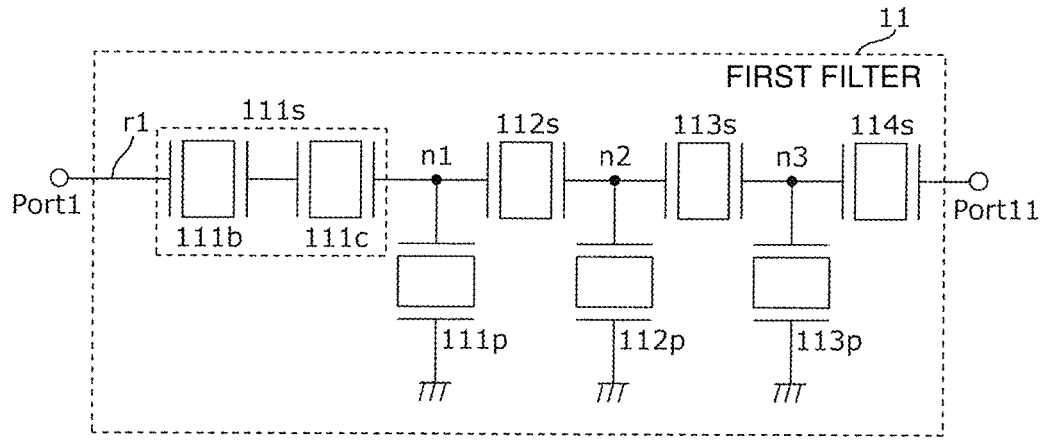
FIG. 11 is a circuit diagram of a first filter according to modification 2 of preferred embodiment 1 of the present invention.

FIG. 11 is a circuit diagram of the first filter 11 according to modification 2 of preferred embodiment 1. As shown in FIG. 11, in the multiplexer 1 according to modification 2, the series resonator 111s of the first filter 11 is defined by two serially connected series resonators 111b and 111c.

In the multiplexer 1 according to modification 2 of preferred embodiment 1, the weight per unit area of the IDT electrode of each of the series resonators 111b and 111c is set larger than the weight per unit area of the IDT electrode of each of the resonators 112s to 114s, 112p, and 113p. The weight per unit area of the IDT electrode of the series resonator 111b and the weight per unit area of the IDT electrode of the series resonator 111c may be the same as each other or may be different from each other.

Thus, a response generated in the stop band of the first filter 11 is able to be significantly reduced or prevented.

Preferred Embodiment 2

In a multiplexer 1 of preferred embodiment 2 of the present invention, a first filter 11A preferably has a π-type ladder filter structure in contrast to the first filter 11 of preferred embodiment 1 which has a T-type ladder filter structure.

Figure 12:
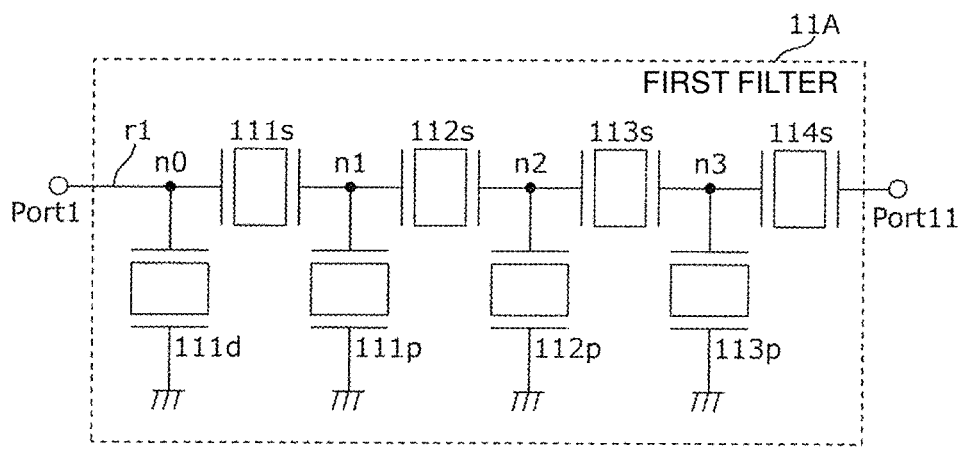
FIG. 12 is a circuit diagram showing a first filter of a multiplexer according to preferred embodiment 2 of the present invention.

FIG. 12 is a circuit diagram of the first filter 11A of the multiplexer 1 according to preferred embodiment 2. As shown in FIG. 12, the first filter 11A includes series resonators 111s to 114s and parallel resonators 111d and 111p to 113p.

The series resonators 111s to 114s are connected in series with each other in this order from the side near the common terminal Port 1 on the first path (series arm) r1 connected between the common terminal Port 1 and the first terminal Port 11. The parallel resonator 111d is connected on a path (parallel arm) connected between a node n0 between the common terminal Port 1 and the series resonator 111s, and a reference terminal (ground). Specifically, the parallel resonator 111d, which is closest to the common terminal Port 1, is connected to the common terminal Port 1 without any of the series resonators 111s to 114s located therebetween. Furthermore, the parallel resonators 111p to 113p are connected in parallel with each other on paths connected between nodes n1, n2, and n3, which are located between adjacent series resonators 111s to 114s on the first path r1, and reference terminals.

Thus, the first filter 11A preferably has a π-type ladder filter structure including one or more series resonators arranged on the first path r1 (for example, the four series resonators 111s to 114s) and two or more parallel resonators arranged on paths connected between the first path r1 and reference terminals (for example, the four parallel resonators 111d and 111p to 113p).

In the first filter 11A, the weight per unit area of the IDT electrode 32 of at least one out of the parallel resonator 111d and the series resonator 111s is larger than the weight per unit area of the IDT electrode 32 of each of the remaining resonators 112s to 114s and 111p to 113p. Here, the series resonator 111s is an example of a first series resonator, the parallel resonator 111d is an example of a first parallel resonator, and the resonators 112s to 114s and 111p to 113p are examples of the remaining resonators.

A response generated in the stop band of the first filter 11A is able to be significantly reduced or prevented by including the above-described features for at least one out of the parallel resonator 111d and the series resonator 111s, which more strongly affect the second filter 21, out of the series resonators 111s to 114s and the parallel resonators 111d and 111p to 113p of the first filter 11A.

In addition, in the first filter 11A, the weights per unit area of the IDT electrodes of both the parallel resonator 111d and the series resonator 111s may be larger than the weight per unit area of the IDT electrode of each of the remaining resonators 112s to 114s and 111p to 113p. The weight per unit area of the IDT electrode of the series resonator 111d and the weight per unit area of the IDT electrode of the series resonator 111s may be the same as each other or may be different from each other.

A response generated in the stop band of the first filter 11A is able to be further reduced or prevented by including the above-described features for both the parallel resonator 111d and the series resonator 111s, which affect the second filter 21, out of the series resonators 111s to 114s and the parallel resonators 111d and 111p to 113p of the first filter 11A.

Modification 1 of Preferred Embodiment 2

In a multiplexer 1 according to modification 1 of preferred embodiment 2, a parallel resonator 111d of a first filter 11A is defined by divided resonators.

Figure 13:
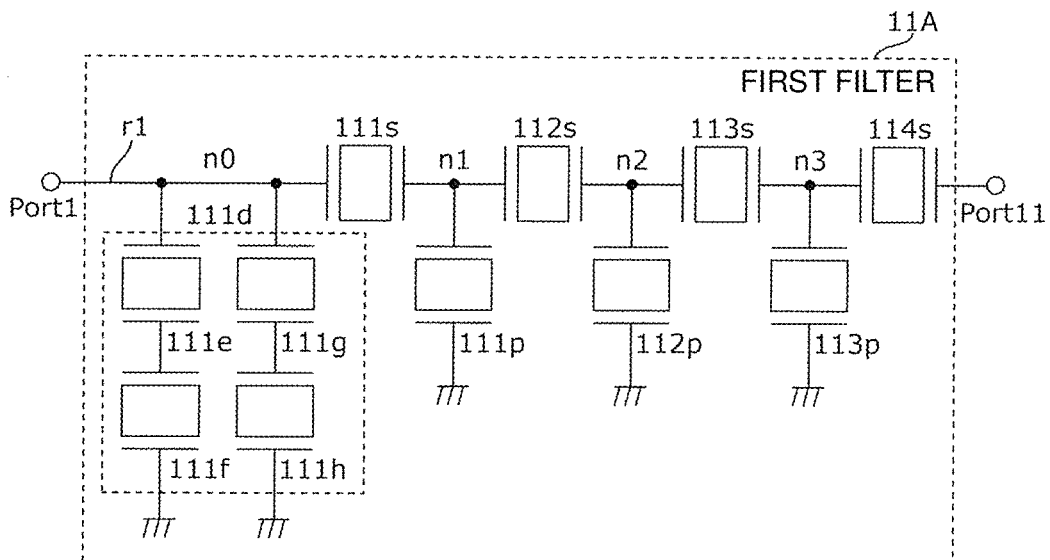
FIG. 13 is a circuit diagram of a first filter according to modification 1 of preferred embodiment 2 of the present invention.

FIG. 13 is a circuit diagram of the first filter 11A according to modification 1 of preferred embodiment 2. As shown in FIG. 13, in the first filter 11A, serially connected resonators 111e and 111f and serially connected resonators 111g and 111h are connected in parallel with each other and together form the parallel resonator 111d.

In the multiplexer 1 according to modification 1 of preferred embodiment 2, the weight per unit area of the IDT electrode of each of the series resonators 111e to 111h of the parallel resonator 111d is larger than the weight per unit area of the IDT electrode of each of the resonators 112s to 114s and 111p to 113p. The weights per unit area of the IDT electrodes of the resonators 111e to 111h may be the same as each other or may be different from each other.

Thus, a response generated in the stop band of the first filter 11A is able to be significantly reduced or prevented.

Preferred Embodiment 3

The multiplexers according to preferred embodiments 1 and 2 and the modifications thereof described above can also be applied to radio-frequency front end circuits and to communication devices that each include such a radio-frequency front end circuit. Accordingly, such a radio-frequency front end circuit and such a communication device will be described in preferred embodiment 3 of the present invention.

Figure 14:
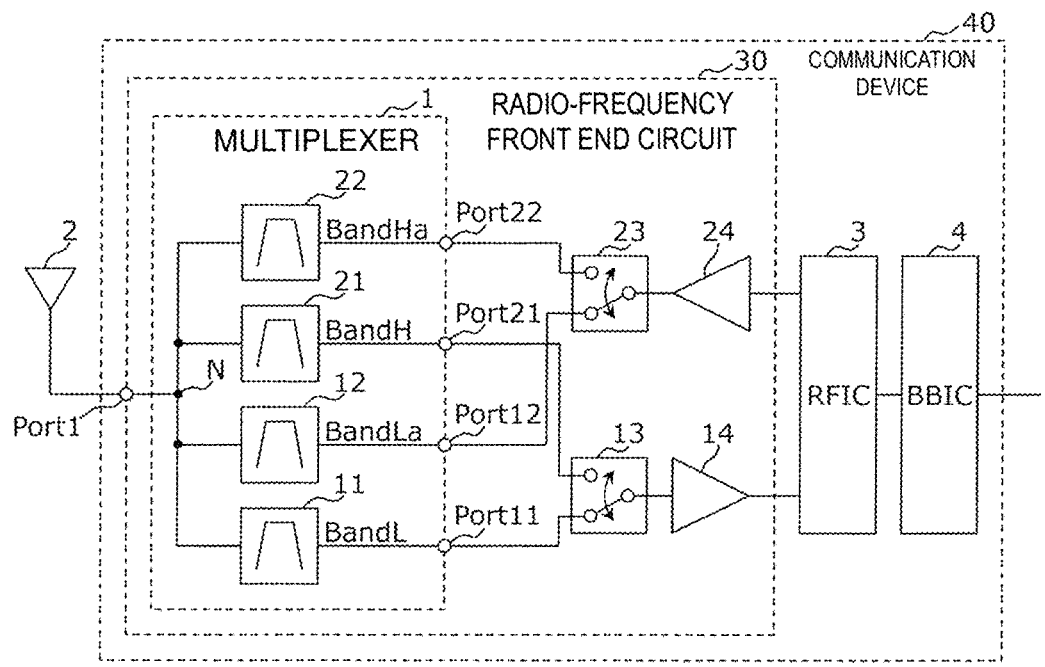
FIG. 14 is a diagram of a radio-frequency front end circuit according to preferred embodiment 3 of the present invention.

FIG. 14 is a diagram of a radio-frequency front end circuit 30 according to preferred embodiment 3. The figure also shows an antenna element 2, an RF signal processing circuit (RFIC) 3, and a baseband signal processing circuit (BBIC) 4, which are connected to the radio-frequency front end circuit 30. A communication device 40 is formed of the radio-frequency front end circuit 30, the RF signal processing circuit 3, and the baseband signal processing circuit 4.

The radio-frequency front end circuit 30 includes the multiplexer 1 according to preferred embodiment 1, a reception switch 13 and a transmission switch 23, a low-noise amplifier circuit 14, and a power amplifier circuit 24.

The multiplexer 1 includes four filters. Specifically, the multiplexer 1 includes a filter 12 and a filter 22 in addition to the first filter 11 and the second filter 21. The filter 12 is a transmission filter that has an uplink frequency band (transmission band) as the pass band thereof and is arranged on a path connected between the common terminal Port 1 and an individual terminal Port 12. The filter 22 is a transmission filter that has an uplink frequency band (transmission band) as the pass band thereof and is arranged on a path connected between the common terminal Port 1 and an individual terminal Port 22.

The reception switch 13 is a switch circuit that includes two selection terminals that are individually connected to the first terminal Port 11 and the second terminal Port 21, which are output terminals of the multiplexer 1, and a common terminal that is connected to the low-noise amplifier circuit 14.

The transmission switch 23 is a switch circuit that includes two selection terminals that are individually connected to the individual terminals Port 12 and Port 22, which are input terminals of the multiplexer 1, and a common terminal that is connected to the power amplifier circuit 24.

The reception switch 13 and the transmission switch 23 each connect the common terminal thereof and a signal path corresponding to a prescribed band to each other in accordance with a control signal from a controller (not shown) and are preferably, for example, each defined by a single pole double throw (SPDT) switch. The number of selection terminals connected to the common terminal is not limited to one and may be a plurality. In other words, the radio-frequency front end circuit 30 may support carrier aggregation.

The low-noise amplifier circuit 14 is a reception amplification circuit that amplifies a radio-frequency signal (in this case, radio-frequency reception signal) received via the antenna element 2, the multiplexer 1, and the reception switch 13 and outputs the amplified signal to the RF signal processing circuit 3.

The power amplifier circuit 24 is transmission amplification circuit that amplifies a radio-frequency signal (here, radio-frequency transmission signal) output from the RF signal processing circuit 3 and outputs the amplified radio-frequency signal to the antenna element 2 via the transmission switch 23 and the multiplexer 1.

The RF signal processing circuit 3 subjects a radio-frequency reception signal input thereto from the antenna element 2 via a reception signal path to signal processing using down conversion and so forth, and outputs the reception signal generated through this signal processing to the baseband signal processing circuit 4. In addition, the RF signal processing circuit 3 subjects a transmission signal input from the baseband signal processing circuit 4 to signal processing using up conversion and so forth and outputs a radio-frequency transmission signal generated through this signal processing to the power amplifier circuit 24. The RF signal processing circuit 3 is preferably an RFIC, for example.

A signal processed by the baseband signal processing circuit 4 is used for image display as an image signal or for a phone call as an audio signal, for example.

The radio-frequency front end circuit 30 may include other circuit elements between the above-described elements.

The above-described radio-frequency front end circuit 30 and communication device 40 include the multiplexer 1 according to preferred embodiment 1 described above and, therefore, is able to be significantly reduce or prevent a stop band response generated outside the pass band of the first filter 11 and can reduce insertion loss generated inside the pass band of the second filter 21.

The radio-frequency front end circuit 30 may include the first filter 11 of modification 1 of preferred embodiment 1 or the first filter 11A according to preferred embodiment 2 or modification 1 of preferred embodiment 2 instead of the first filter 11 of the multiplexer 1 according to preferred embodiment 1.

In addition, depending on the radio-frequency signal processing method used, the communication device 40 may not necessarily include the baseband signal processing circuit 4.

Other Preferred Embodiments

Multiplexers, radio-frequency front end circuits, and communication devices according to preferred embodiments of the present invention have been described above in the form of preferred embodiments and modifications thereof, but other preferred embodiments provided by combining any of the elements of the above-described preferred embodiments and modifications with one another, modifications obtained by modifying the above-described preferred embodiments in various ways, as thought of by one skilled in the art, without departing from the gist of the present invention, and various devices including a radio-frequency front end circuit and a communication device according to preferred embodiments of the present invention built thereinto are also included in the scope of the present invention.

For example, a multiplexer that includes four filters has been described as an example in preferred embodiment 3 above, but, for example, the present invention can also be applied to a triplexer in which the antenna terminals of three filters are connected together to define a common connection or a hexaplexer in which the antenna terminals of six filters are connected together to define a common connection. In other words, it is sufficient that the multiplexer include at least two filters.

Furthermore, an example in which both the first filter and the second filter are reception filters has been described in preferred embodiment 1. However, as long as there is a multiplexer in which the stop band response of a first filter is located inside the pass band of a second filter, the present invention can be applied to the multiplexer without there being limitations on the uses of the first and second filters and so on. Therefore, at least either one of the first and second filters may be a reception filter. The multiplexer is not limited to including both a transmission filter and a reception filter, and may instead include only transmission filters or only reception filters.

Furthermore, an example in which the resonator 110 does not include offset electrode fingers (electrode that faces electrode fingers and protrudes from busbar electrode on the opposite side) has been described in preferred embodiment 1, but the present invention is not limited to this example and each resonator may include offset electrode fingers.

Furthermore, the materials defining the adhesive layer 324, the main electrode layer 325, and the protective layer 326 of the IDT electrode 32 and the reflectors 32c are not limited to the materials described above. In addition, the IDT electrode 32 does not have to have a multilayer structure. For example, the IDT electrode 32 may be formed of a metal such as Ti, Al, Cu, Pt, Au, Ag, or Pd or an alloy of such a metal, and may include a plurality of multilayer bodies including such metals or alloys. In addition, the protective layer 326 does not have to be formed.

Furthermore, in the substrate 320 of the resonator 110 of preferred embodiment 1, the high-acoustic-velocity support substrate 329 may have a structure in which a support substrate and a high-acoustic-velocity film, in which the acoustic velocity of a propagating bulk wave is higher than that of an acoustic wave, for example, a surface acoustic wave or a boundary acoustic wave propagating along the piezoelectric layer 327, are stacked one on top of the other.

Furthermore, an example in which the IDT electrode 32 of the first filter 11 is provided on the substrate 320 including the piezoelectric layer 327 has been described in preferred embodiment 1, but the substrate on which the IDT electrode 32 is provided may instead be a piezoelectric substrate including a single layer defined by the piezoelectric layer 327. The piezoelectric substrate in this case is, for example, made of a $LiTaO_3$ piezoelectric single crystal or another piezoelectric single crystal such as $LiNbO_3$. In addition, as long as the substrate 320 on which the IDT electrode 32 is provided exhibits piezoelectricity, a structure in which a piezoelectric layer is stacked on a support substrate may instead be used for the substrate 320 rather than the substrate 320 completely defined by a piezoelectric layer.

In addition, a 50° Y cut X propagation $LiTaO_3$ single crystal is included as the piezoelectric layer 327 in preferred embodiment 1, but the cut angle of the single crystal material is not limited to this example. In other words, the multilayer structure, material, and thickness may be changed as appropriate in accordance with the predetermined bandpass characteristics of the acoustic wave filter device and the same or similar advantageous effects can be achieved with an acoustic wave filter that includes a $LiTaO_3$ piezoelectric substrate or a $LiNbO_3$ piezoelectric substrate having a different cut angle.

A multiplexer according to a preferred embodiment of the present invention includes a common terminal; a first terminal; and a second terminal; a first filter that is provided on a first path electrically connected between the common terminal and the first terminal and includes a plurality of acoustic wave resonators; and a second filter that is provided on a second path electrically connected between the common terminal and the second terminal and that has a pass band located at a higher frequency than that of the first filter. The plurality of acoustic wave resonators includes two or more series resonators provided on the first path and one or more parallel resonators provided on paths electrically connected between nodes on the first path and ground. A first series resonator that is closest to the common terminal among the two or more series resonators is electrically connected to the common terminal without any of the parallel resonators located therebetween. The plurality of acoustic wave resonators each include a substrate exhibiting piezoelectricity and an IDT electrode including a pair of comb-shaped electrodes provided on the substrate. A weight per unit area of the IDT electrode of at least one out of the first series resonator and a first parallel resonator that is closest to the common terminal among the one or more parallel resonators is larger than that of the IDT electrode of each of the remainder of the plurality of acoustic wave resonators.

Thus, the stop band response of at least one of the first series resonator and the first parallel resonator, which greatly affect the second filter, is able to be significantly reduced or prevented by setting the weight per unit area of the IDT electrode of at least one out of the first series resonator and the first parallel resonator to be larger than the weight per unit area of the IDT electrode of each of the remaining resonators. Thus, a response generated in the stop band of the first filter is able to be significantly reduced or prevented and the insertion loss in the pass band of the second filter can be reduced.

Furthermore, the weights per unit area of the IDT electrodes of both the first series resonator and the first parallel resonator may be larger than the weight per unit area of the IDT electrode of each of the remainder of the plurality of acoustic wave resonators.

Thus, the stop band responses of both the first series resonator and the first parallel resonator, which affect the second filter, are able to be significantly reduced or prevented by setting the weights per unit area of the IDT electrodes of both of the first series resonator and the first parallel resonator to be larger than the weight per unit area of the IDT electrode of each of the remaining resonators. Thus, a response generated in the stop band of the first filter is able to be significantly reduced or prevented and the insertion loss in the pass band of the second filter can be reduced.

In order to achieve the above-described advantageous effects, a preferred embodiment of the present invention provides a multiplexer that includes a common terminal; a first terminal; and a second terminal; a first filter that is provided on a first path electrically connected between the common terminal and the first terminal and includes a plurality of acoustic wave resonators; and a second filter that is provided on a second path electrically connected between the common terminal and the second terminal and that has a pass band located at a higher frequency than that of the first filter. The plurality of acoustic wave resonators includes one or more series resonators provided on the first path and two or more parallel resonators provided on paths electrically connected between the first path and ground. The two or more parallel resonators include a first parallel resonator that is located on a side where the common terminal is provided and a parallel resonator that is located on a side where the first terminal is provided as seen from a first series resonator that is closest to the common terminal among the one or more series resonators. The plurality of acoustic wave resonators each include a substrate exhibiting piezoelectricity and an IDT electrode including a pair of comb-shaped electrodes provided on the substrate. A weight per unit area of the IDT electrode of at least one out of the first parallel resonator and the first series resonator is larger than a weight per unit area of the IDT electrode of each of the remainder of the plurality of the acoustic wave resonators.

Thus, the stop band response of at least one out of the first parallel resonator and the first series resonator, which greatly affect the second filter, is able to be significantly reduced or prevented by setting the weight per unit area of the IDT electrode of at least one out of the first parallel resonator and the first series resonator to be larger than the weight per unit area of the IDT electrode of each of the remaining resonators. Thus, a response generated in the stop band of the first filter is able to be significantly reduced or prevented and the insertion loss in the pass band of the second filter can be reduced.

Furthermore, the weights per unit area of the IDT electrodes of both the first parallel resonator and the first series resonator may be larger than the weight per unit area of the IDT electrode of each of the remainder of the plurality of acoustic wave resonators.

Thus, the stop band responses of both the first parallel resonator and the first series resonator, which affect the second filter, are able to be significantly reduced or prevented by setting the weights per unit area of the IDT electrodes of both of the first parallel resonator and the first series resonator to be larger than the weight per unit area of the IDT electrode of each of the remaining resonators. Thus, a response generated in the stop band of the first filter is able to be significantly reduced or prevented and the insertion loss in the pass band of the second filter can be reduced.

In addition, the substrate may include a piezoelectric layer that includes the IDT electrode provided on one main surface thereof, a high-acoustic-velocity support substrate in which an acoustic velocity of a propagating bulk wave is higher than an acoustic velocity of an acoustic wave propagating along the piezoelectric layer, and a low-acoustic-velocity film that is provided between the high-acoustic-velocity support substrate and the piezoelectric layer and in which an acoustic velocity of a propagating bulk wave is lower than an acoustic velocity of an acoustic wave propagating along the piezoelectric layer.

Thus, the Q value of each resonator including an IDT electrode provided on a substrate including a piezoelectric layer can be maintained at a high value.

Furthermore, a frequency of a stop band response generated by the first filter may be included in a frequency pass band of the second filter.

Thus, a response generated in the stop band of the first filter is able to be significantly reduced or prevented and the insertion loss in the pass band of the second filter can be reduced.

In addition, a radio-frequency front end circuit according to a preferred embodiments of the present invention includes any one of the multiplexers described above; and an amplification circuit that is electrically connected to the multiplexer.

Thus, a radio-frequency front end circuit can be provided that is able to significantly reduce or prevent a response generated in a stop band of the first filter and can reduce pass band insertion loss in the second filter.

In addition, a communication device according to a preferred embodiment of the present invention includes an RF signal processing circuit that processes a radio-frequency signal transmitted or received by an antenna element; and the above-described radio-frequency front end circuit, which transmits the radio-frequency signal between the antenna element and the RF signal processing circuit.

Thus, a communication device can be provided that is able to significantly reduce or prevent a response generated in the stop band of the first filter and can reduce insertion loss in the pass band of the second filter.

Preferred embodiments of the present invention can be widely applied to communication devices, for example, mobile phones in the form of a multiplexer, a front end circuit, and a communication device applicable to multi-band systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal;
   a first terminal;
   a second terminal;
   a first filter on a first path electrically connected between the common terminal and the first terminal and including a plurality of acoustic wave resonators; and
   a second filter on a second path electrically connected between the common terminal and the second terminal and having a pass band located at a higher frequency than that of the first filter; wherein
   the plurality of acoustic wave resonators includes:
     one or more series resonators on the first path; and
     two or more parallel resonators on paths electrically connected between the first path and ground;
   the two or more parallel resonators include a first parallel resonator that is located on a side where the common terminal is provided and a parallel resonator that is located on a side where the first terminal is provided as seen from a first series resonator that is closest to the common terminal among the one or more series resonators;
   the plurality of acoustic wave resonators each include a substrate that exhibits piezoelectricity and an interdigital transducer (IDT) electrode including a pair of comb-shaped electrodes on the substrate; and
   a portion having a unit area, in a plan view of the substrate, has a larger weight in the IDT electrode of at least one out of the first parallel resonator and the first series resonator than in the IDT electrode of at least one of the remainder of the plurality of acoustic wave resonators.

2. The multiplexer according to claim 1, wherein the portion having a unit area, in a plan view of the substrate, has a larger weight in the IDT electrode of at least one out of the first parallel resonator and the first series resonator than in the IDT electrode of each of the remainder of the plurality of acoustic wave resonators.

3. The multiplexer according to claim 1, wherein the portion having a unit area, in a plan view of the substrate, has a larger weight in the IDT electrodes of both the first parallel resonator and the first series resonator than in the IDT electrode of at least one of the remainder of the plurality of acoustic wave resonators.

4. The multiplexer according to claim 3, wherein the portion having a unit area, in a plan view of the substrate, has a larger weight in the IDT electrodes of both the first parallel resonator and the first series resonator than in the IDT electrode of each of the remainder of the plurality of acoustic wave resonators.

5. A multiplexer comprising:
   a common terminal;
   a first terminal;
   a second terminal;
   a first filter on a first path electrically connected between the common terminal and the first terminal and including a plurality of acoustic wave resonators; and
   a second filter on a second path electrically connected between the common terminal and the second terminal and having a pass band located at a higher frequency than that of the first filter; wherein
   the plurality of acoustic wave resonators include:
     two or more series resonators on the first path; and
     one or more parallel resonators on paths electrically connected between nodes on the first path and ground;
   a first series resonator that is closest to the common terminal among the two or more series resonators is electrically connected to the common terminal without any of the parallel resonators located therebetween;

the plurality of acoustic wave resonators each include a substrate that exhibits piezoelectricity and an interdigital transducer (IDT) electrode including a pair of comb-shaped electrodes on the substrate; and a portion having a unit area, in a plan view of the substrate, has a larger weight in the IDT electrode of at least one of the first series resonator and a first parallel resonator that is closest to the common terminal among the one or more parallel resonators than in the IDT electrode of at least one of a remainder of the plurality of acoustic wave resonators.

6. The multiplexer according to claim 5, wherein the portion having a unit area, in a plan view of the substrate, has a larger weight in the IDT electrode of at least one of the first series resonator and the first parallel resonator than in the IDT electrode of each of the remainder of the plurality of acoustic wave resonators.

7. The multiplexer according to claim 5, wherein the portion having a unit area, in a plan view of the substrate, has a larger weight in the IDT electrodes of both the first series resonator and the first parallel resonator than in the IDT electrode of at least one of the remainder of the plurality of acoustic wave resonators.

8. The multiplexer according to claim 7, wherein the portion having a unit area, in a plan view of the substrate, has a larger weight in the IDT electrodes of both the first series resonator and the first parallel resonator than in the IDT electrode of each of the remainder of the plurality of acoustic wave resonators.

9. The multiplexer according to claim 5, wherein the substrate includes:
   a piezoelectric layer with the IDT electrode provided on one main surface thereof;
   a high-acoustic-velocity support substrate in which an acoustic velocity of a propagating bulk wave is higher than an acoustic velocity of an acoustic wave propagating along the piezoelectric layer; and
   a low-acoustic-velocity film between the high-acoustic-velocity support substrate and the piezoelectric layer and in which an acoustic velocity of a propagating bulk wave is lower than an acoustic velocity of a bulk wave propagating along the piezoelectric layer.

10. The multiplexer according to claim 9, wherein
    $\lambda$ is a wavelength of an acoustic wave propagating along the piezoelectric layer;
    a thickness of the piezoelectric layer is less than or equal to about $3.5\lambda$; and
    a thickness of the low-acoustic-velocity film is less than or equal to about $2\lambda$.

11. The multiplexer according to claim 5, wherein a frequency of a stop band response generated by the first filter is included in a frequency pass band of the second filter.

12. A radio-frequency front end circuit comprising:
    the multiplexer according to claim 5; and
    an amplification circuit that is electrically connected to the multiplexer.

13. A communication device comprising:
    an RF signal processing circuit that processes a radio-frequency signal transmitted or received by an antenna element; and
    the radio-frequency front end circuit according to claim 12, which transmits the radio-frequency signal between the antenna element and the RF signal processing circuit.

14. The communication device to claim 13, wherein the antenna element is electrically connected to the common terminal.

15. The multiplexer according to claim 5, wherein the first filter includes a T-type ladder filter structure.

16. The multiplexer according to claim 5, wherein
    the two or more series resonators includes at least four series resonators; and
    the one or more parallel resonators includes at least three parallel resonators.

17. The multiplexer according to claim 5, wherein each of the plurality of acoustic wave resonators is a surface acoustic wave (SAW) resonator or a bulk acoustic wave (BAW) resonator.

18. The multiplexer according to claim 5, wherein a weight per unit area of the IDT electrode is defined as a product of an average electrode film thickness and an average electrode material density in a specific portion of the IDT electrode.

* * * * *